US009790912B2

(12) United States Patent
Habermann et al.

(10) Patent No.: US 9,790,912 B2
(45) Date of Patent: Oct. 17, 2017

(54) GLOW TIME CONTROL DEVICE

(71) Applicant: VOLKSWAGEN AKTIENGESELLSCHAFT, Wolfsburg (DE)

(72) Inventors: Viktoria Habermann, Wolfsburg (DE); Wolf-Rüdiger Schillinger, Konigslutter (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 457 days.

(21) Appl. No.: 14/382,440

(22) PCT Filed: Feb. 7, 2013

(86) PCT No.: PCT/EP2013/052367
§ 371 (c)(1),
(2) Date: Sep. 2, 2014

(87) PCT Pub. No.: WO2013/131702
PCT Pub. Date: Sep. 12, 2013

(65) Prior Publication Data
US 2015/0101556 A1    Apr. 16, 2015

(30) Foreign Application Priority Data
Mar. 3, 2012   (DE) .................. 10 2012 004 387

(51) Int. Cl.
*F02P 19/02*    (2006.01)
*H02H 11/00*   (2006.01)
(Continued)

(52) U.S. Cl.
CPC .......... *F02P 19/021* (2013.01); *F02M 31/125* (2013.01); *F02P 19/027* (2013.01);
(Continued)

(58) Field of Classification Search
CPC ........ F02P 19/02; F02P 19/021; F02P 19/023; F02P 19/027
See application file for complete search history.

(56) References Cited

U.S. PATENT DOCUMENTS 4,511,792 A * 4/1985 Kawamura ........... F02P 19/021
                                                    123/179.21
4,962,300 A * 10/1990 Watanabe ............. F02P 19/025
                                                    123/179.21
(Continued)

FOREIGN PATENT DOCUMENTS

DE    38 39 156 C2    5/1990
DE    41 34 495 A1    4/1993
(Continued)

OTHER PUBLICATIONS

German Search Report issued for German Patent Application No. DE 10 2012 004 387.2, mailed Sep. 4, 2012.
(Continued)

*Primary Examiner* — Joseph Dallo
*Assistant Examiner* — Anthony L Bacon
(74) *Attorney, Agent, or Firm* — Pearl Cohen Zedek Latzer Baratz LLP

(57) ABSTRACT

The present invention relates to a glow time control device (100) for controlling glow rods (206-209) in a vehicle (200). The glow time control device (100) comprises a control unit (IC1), at least two power transistors (T1, T4) and a protective circuit (T6, T7). The control unit (IC1) comprises a control output (GG1) for emitting a control signal, a supply voltage input (VCC) and a supply voltage output (VDD). The control unit (IC1) provides an output voltage at the supply voltage output (VDD) depending on a voltage at the supply voltage input (VCC). A corresponding glow rod control output (G1, G4) is assigned to each of the power transistors (T1, T4) and the control inputs of the power
(Continued)

transistors (T1, T4) are coupled to the control output (GG1). The protective circuit (T6, T7) comprises a protective circuit output which is coupled to the control inputs of the power transistors (T1, T4), and an input which is coupled to the supply voltage output (VDD). The protective circuit adjusts a predefined potential at the protective circuit output if the output voltage of the control unit (IC1) is below a predefined value.

3 Claims, 2 Drawing Sheets

(51) Int. Cl.
  *H03K 17/082* (2006.01)
  *F02M 31/125* (2006.01)
(52) U.S. Cl.
  CPC ......... *H02H 11/006* (2013.01); *H03K 17/082* (2013.01); *F02P 19/023* (2013.01)

(56) References Cited

U.S. PATENT DOCUMENTS

| | | | | |
|---|---|---|---|---|
| 6,009,369 | A | * | 12/1999 | Boisvert ............... F02P 19/026 123/145 A |
| 6,148,258 | A | * | 11/2000 | Boisvert ............... F02P 19/022 123/145 A |
| 2014/0184302 | A1 | * | 7/2014 | Makita ..................... H01P 5/16 327/374 |

FOREIGN PATENT DOCUMENTS

| | | |
|---|---|---|
| DE | 196 17 790 A1 | 11/1997 |
| DE | 197 07 769 A1 | 9/1998 |
| DE | 19817790 A1 | 12/1999 |
| DE | 198 40 300 A1 | 3/2000 |
| DE | 100 13 939 A1 | 9/2001 |
| DE | 100 48 184 A1 | 4/2002 |
| DE | 10 2008 001114 A1 | 10/2009 |
| EP | 0 358 924 A1 | 3/1990 |
| EP | 2 133 554 A1 | 12/2009 |
| FR | 2682831 A1 | 4/1993 |
| JP | S55 134761 A | 10/1980 |
| JP | 2008 063967 A | 3/2008 |

OTHER PUBLICATIONS

International Search Report issued for PCT Patent Application No. PCT/EP2013/052367, mailed Sep. 16, 2013.

* cited by examiner

GLOW TIME CONTROL DEVICE

CROSS-REFERENCE TO RELATED APPLICATIONS

This application is a National Phase Application of PCT International Application No. PCT/EP2013/052367, International Filing Date Feb. 7, 2013, claiming priority to German Patent Application No. 10 2012 004 387.2, filed Mar. 3, 2012, which is hereby incorporated by reference in its entirety.

FIELD OF THE INVENTION

The present invention relates to a glow time control device for actuating glow plugs in the engine of a motor vehicle. In particular, the present invention relates to protective circuits in the glow time control device that serve to prevent damage to the glow time control device and to the glow plugs that are connected to it.

BACKGROUND OF THE INVENTION

Internal combustion engines of motor vehicles such as, for instance, passenger cars or trucks, especially diesel engines, can make use of glow plugs to assist combustion in the internal combustion engine. Such glow plugs are also referred to as glow pencils. The glow plugs are actuated by a glow time control device using electric energy from the electrical system of the vehicle. Glow pencils are normally operated at a prescribed rated voltage of, for example, 5.5 volts. If the glow time control device is incorrectly connected during the assembly or servicing of the vehicle, voltages that can damage or destroy the glow time control device might be applied to the inputs and outputs of the glow time control device. A damaged or destroyed glow time control device, in turn, can damage a glow pencil that is connected to it.

In this context, German patent application DE 100 13 939 A1 discloses an electric circuit having reverse polarity protection. Reverse polarity protection is provided in the positive supply line of the circuit, and the reverse polarity protection has an N-channel MOSFET transistor with a Zener diode connected in parallel as well as a small-signal MOSFET transistor with a Zener diode connected in parallel. The drain terminals of the two transistors are provided for the feed via the positive supply line, whereas the gate terminal of the N-channel MOSFET transistor is provided for the feed via a power bridge circuit and is connected to the source terminal of the small-signal MOSFET transistor.

German patent application DE 10 2008 001 114 A1 discloses a control circuit for glow pencils that serves to protect against polarity reversal. A control unit comprises a first field-effect transistor that is interconnected with the glow plug in a shared current path. Moreover, there is a second field-effect transistor that is connected to the first transistor in the opposite direction so that the current flow in the current path is blocked in both directions. A switching unit is configured to activate the second transistor so that the current flow can be released in the direction of a current path corresponding to the prescribed polarity of the glow plug.

German patent application DE 100 48 184 A1 relates to a reverse-voltage protective circuit that serves to protect a control device that is supplied by a direct-voltage source against a reverse voltage in case of a polarity reversal. The reverse-voltage protective circuit comprises a MOSFET that is connected between the direct-voltage source and the control device, whereby the source terminal of the MOSFET is connected to the positive terminal of the direct-voltage source, and, by means of a driver that can be actuated by the control device, the gate terminal of the MOSFET can be impinged upon in such a manner that the MOSFET is switched on. The gate-source path can be protected against overvoltage by means of two Z-diodes that are series-connected in opposition and that are connected to each other via their anodes.

German patent application DE 198 177 90 A1 relates to a reverse polarity protection in which a semiconductor switch is connected in parallel to a reverse-polarity protection diode, and this semiconductor switch is switched off in case of a polarity reversal, whereas it is switched on during normal operation.

German patent application DE 198 40300 A1 relates to a reverse-polarity protection circuit for an electronic power output stage that can be actuated by a trigger circuit. When it comes to this reverse-polarity protection circuit, if the polarity of the supply voltage is incorrect, then power FETs are used in at least one supply terminal in order to interrupt the through-connection of the incorrectly applied supply voltage to the trigger circuit and to the power output stage.

German patent application DE 41 344 95 A1 relates to a control device for electric motors in motor vehicles which meets the requirements in terms of short-circuit strength, reverse polarity protection, load-dump protection, interlocks against malfunctions, etc. The reverse polarity protection is achieved by means of a transistor. If the motor is supposed to pick up current, then the transistor is switched on via two diodes as well as via a resistor. At this point in time, the transistor would be operated inversely. As a result, the parasitic diode (source-drain) of the transistor is greatly relieved since the current flows via the drain-source path. Only a greatly diminished power loss occurs.

Aside from a polarity reversal and an inadvertent connection of a terminal of the glow time control device to +12 V or to the ground, it can also happen that electrostatic discharges at the terminals of the glow time control device could cause the destruction of the latter. Moreover, especially in the case of a glow time control device that is suitable for actuating several glow pencils in a multi-cylinder engine, interactions can occur between the control outputs for the glow pencils. This can especially happen if several power switches, for instance, FETs, are actuated in the glow time control device by a shared control output of a control unit of the glow time control device.

SUMMARY OF THE INVENTION

Before this backdrop, the objective of the present invention is to put forward protective circuits in the glow time control device that prevent the destruction of the glow time control device as well as of the glow pencils connected to it if the glow time control device is improperly connected.

This objective is achieved by means of a glow time control device as well as by a vehicle. The claims define preferred and advantageous embodiments of the invention.

According to the present invention, a glow time control device is put forward for actuating glow pencils in a vehicle. The glow time control device comprises a control unit, at least two power transistors and a protective circuit. The control unit has a control output for emitting a control signal. Moreover, the control unit has a supply-voltage input and a supply-voltage output, and it is configured to provide an output voltage at the supply-voltage output as a function of the voltage at the supply-voltage input. In each case, a glow pencil control output of the glow time control device is associated with each one of the at least two power transistors, and the control inputs of the at least two power transistors are jointly coupled to the control output of the control unit. Glow pencils can be connected to the glow pencil control outputs so that they can be actuated. The protective circuit comprises a protective circuit output that is coupled to the control inputs of the at least two power transistors, and an input that is coupled to the supply-voltage output of the control unit. The protective circuit is configured to set a prescribed potential at the protective circuit output if the output voltage of the control unit is below a prescribed value. This makes it possible to ensure that the power transistors are blocked if no reliable signal has been made available by the control unit, as can happen, for example, when the control unit is not reliably coupled to a supply voltage or connected to the ground. In this case, the desired supply voltage is not made available at the supply-voltage output of the control unit and the protective circuit emits a potential at its protective circuit output, thereby blocking the power transistors. For instance, the prescribed potential at the protective circuit output that serves to block the power transistors can be a chassis potential. Moreover, the protective circuit can ensure that the power transistors do not mutually affect each other if no reliable control signal from the control unit is present at the control inputs of the power transistors. If, for example, a high positive potential is applied at the glow pencil control output of a power transistor, for instance, +12 V, the control input of the power transistor could likewise be raised, as a result of which, owing to the shared connection of the control inputs of the power transistors to the control output of the control unit, the control input of the other power transistor is also raised, as a result of which the power transistor, in turn, would be connected through erroneously. The protective circuit prevents this in that a potential is applied to the control inputs of the power transistors, thereby blocking the power transistors if the control unit does not provide a reliable actuation for the power transistors.

According to the invention, another glow time control device that serves to actuate glow pencils in a vehicle is provided, said glow time control device comprising a control unit, at least two power transistors and at least two transistors. The control unit has a control output for emitting a control signal. The power transistors are each associated with a corresponding glow pencil control output, and the control inputs of the power transistors are jointly coupled to the control output of the control unit. The transistors of the set of at least two transistors are each associated with one of at least two power transistors, that is to say, a transistor is additionally associated with each power transistor. An interrupter of the transistor that is associated with the power transistor is located between the control input and an output of the power transistor. In addition, a diode is located between the transistor and the control input of the power transistor. The transistors can reliably switch off the power transistors when the chassis potential of the glow time control device rises, for example, due to an interruption of the chassis ground. The diodes prevent a high potential at a glow pencil control output of a power transistor from raising the potential of the control input of another power transistor via the coupling of the control inputs of the power transistors. This can reliably prevent an inadvertent through-connection of the power transistors, even in case of chassis loss or chassis shift.

According to one embodiment, the power transistor comprises a field-effect transistor, for instance, a MOSFET or power MOSFET, having a gate terminal as the control input as well as a source terminal and a drain terminal. An emitter of the transistor, which is associated with the power transistor, is coupled to the source terminal. A collector terminal of the transistor is coupled to the gate terminal via the diode, and a base of the transistor is coupled to the source terminal via a capacitor, and coupled to a chassis terminal of the glow time control device via an additional diode. Owing to the additional diode, the base currents of the transistors are decoupled and a current flow direction is prescribed for the base currents. In the case of chassis shift or chassis loss on the part of the glow time control device, the power transistors are switched off by the transistors before the chassis potential relative to the glow pencil potential rises above a threshold voltage that is set by the diode voltage of the additional diodes. The capacitor delays the switching off of the power transistors, for example, by 50 μs to 100 μs, as a result of which a debouncing is achieved.

According to another embodiment, the diode is a Schottky diode. Schottky diodes display a relatively low forward voltage, as a result of which the power transistors can be reliably switched off in that the voltage at the gate of the power transistor can be kept, for instance, below a FET threshold voltage of typically 2 volts.

According to another aspect of the present invention, a glow time control device is provided for actuating glow pencils in a vehicle, said glow time control device comprising a control unit, at least two power transistors and at least two pairs of Zener diodes. The control unit has a control output for emitting a control signal. The power transistors are each associated with a corresponding glow pencil control output, and the control inputs of the power transistors are coupled to the control output of the control unit. Each pair of Zener diodes is associated with one of the power transistors and connected between the control input and an output of the power transistor. A pair of Zener diodes comprises a series connection of two Zener diodes connected in the opposite direction. The Zener diodes can have a Zener voltage, for example, of 18 volts. If the output of a power transistor short-circuits to the ground, this can prevent an overvoltage at the control terminal of the power transistor and at the control terminal of an additional power transistor.

According to the present invention, a glow time control device is also provided that comprises a printed circuit board, a chassis terminal and at least one electric terminal on the printed circuit board. The chassis terminal is coupled to a first conductor of the printed circuit board. The electric terminal is coupled to a second conductor of the printed circuit board and it is configured to connect the second conductor to a device that is external to the glow time control device. The electric terminal can comprise, for instance, a terminal post that receives a control signal for the glow time control device from an external device or that emits a control signal to an external device, for example, to a glow pencil. The glow time control device also comprises an ESD spark gap that is formed adjacent to the electric terminal between the first conductor and the second conductor. An ESD spark gap comprises, for instance, an air gap that is located between the first conductor and the second conductor and that has a prescribed length, that is to say, the ESD spark gap is formed in that the first conductor and the second conductor are moved towards each other over a distance having the prescribed length, without, however, touching each other. The first conductor and the second conductor are thus electrically insulated from each other in the area of the ESD spark gap. Due to the distance with the prescribed length of, for example, less than 1 mm, for instance, 0.1 mm, high voltages between the first conductor and the second conductor in the area of the ESD spark gap can lead to the formation of an electric arc, as a result of which such high voltages are already dissipated to the ground at the electric terminal on the printed circuit board, thus preventing damage to the components of the glow time control device. These high voltages can occur, for example, due to electrostatic discharges (ESD).

According to another aspect of the present invention, a glow time control device is provided to actuate glow pencils in a vehicle, said glow time control device comprising at least two power transistors and at least two fuses. Each power transistor is associated with a corresponding glow pencil control output. Each fuse is associated with one of the at least two power transistors, that is to say, each power transistor and each glow pencil connected thereto are protected individually. In comparison to a shared protection of all of the power transistors via a shared fuse, the individual fuses can have lower thresholds that have to be exceeded before the fuse is tripped. This means that a better protection of the power transistors and glow pencils can be ensured, especially if an error and thus an overload are only present in one glow pencil circuit. Furthermore, the remaining glow pencil circuits can be operated when one glow pencil circuit has been switched off by the associated fuse due to an erroneous connection or overload. This translates into a more reliable operation of the engine in which the glow pencils are being used, and damage to the engine can be prevented. The fuses can be, for instance, fusible cutouts or electronic fuses or resettable fuses.

According to the present invention, a vehicle is likewise provided which comprises at least one glow pencil as well as the above-mentioned control unit that is coupled to the at least one glow pencil. Therefore, the vehicle also entails the advantages of the above-mentioned glow time control device.

Even though the special features were described in the above-mentioned summary as well as in the following detailed description in conjunction with special embodiments of the invention, it is evident that the features of the previously described embodiments can be combined with each other. In particular, the glow time control device can comprise several or all of the previously described features, thereby ensuring a high level of protection of the glow time control device and of the glow pencils connected thereto, even in case of an erroneous connection of electric lines to the glow time control device or to the glow pencils.

BRIEF DESCRIPTION OF THE DRAWINGS

The invention is described in greater detail below making reference to the drawing.

DETAILED DESCRIPTION OF THE INVENTION

Diesel engines make use of glow plugs, which are also referred to as glow pencils, especially in order to reliably ignite the diesel fuel that is injected into the combustion chamber during a cold start of the diesel engine. In order for the glow temperature required to start the engine to be reached as soon as possible during this preheating procedure, the glow pencils are briefly operated in this phase at an elevated voltage—the so-called push voltage—above the rated voltage of the glow pencils. Subsequently, the glow pencils are operated at the glow pencil rated voltage (heating), or even below the glow voltage (post-heating). The voltage of the glow pencils is regulated via a pulse-width modulated signal (PWM signal) stemming from an engine control unit. The PWM rates for the individual glow pencils and actuation phases (pushing, heating, post-heating) are stored in the engine control unit. The individual glow pencils are actuated via power transistors that are controlled by means of pulse-width modulation.

Figure 1:
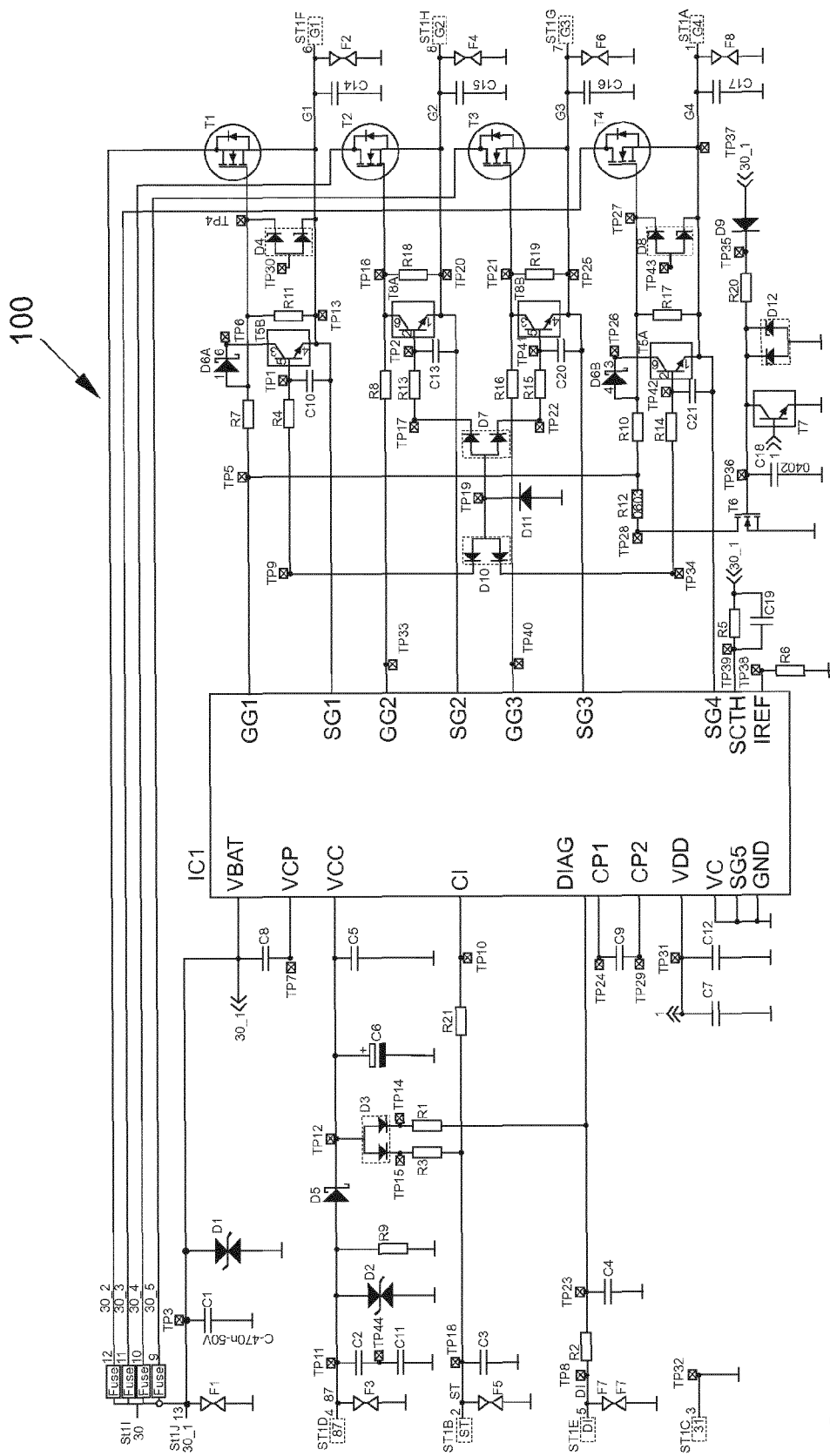
FIG. 1 shows a circuit diagram of a glow time control device according to an embodiment of the present invention.

FIG. 1 shows a circuit diagram of a glow time control device 100 for four glow pencils of a vehicle. The glow time control device 100 comprises four power transistors T1-T4, each of which is associated with a corresponding glow pencil control output G1-G4. The four glow pencils can be connected to the glow pencil control outputs G1-G4. In the through-connected state of the power transistors T1-T4, current from the vehicle electrical system that is fed via a terminal 30 to the control device 100 is carried to the appertaining glow pencil control output G1-G4. The voltage emitted by the glow pencil control outputs G1-G4 is monitored via inputs SG1-SG4 of an integrated circuit IC1. The integrated circuit IC1 also has control outputs GG1-GG3 that serve to actuate the power transistors T1-T4. The integrated circuit IC1, however, has only three control outputs GG1-GG3, so that the control output GG1 is employed to actuate the power transistors T1 and T4. The control outputs GG2 and GG3 each individually control the power transistors T2 and T3. The integrated circuit IC1 additionally encompasses a charging pump that is used to provide the control signals to the control outputs GG1-GG3. The charging pump generates a voltage that is greater than the usual 12 to 14 volts supplied by the vehicle's on-board voltage in order to actuate the power transistors T1-T4 in such a way that the voltage drop over the power transistors T1-T4 is as small as possible so as to prevent a thermal destruction of the power transistors T1-T4. The control signal at the control outputs GG1-GG3 can be, for instance, 25 volts. Moreover, the integrated circuit IC1 generates a supply voltage VDD of approximately 4 volts when the integrated circuit IC1 is active, that is to say, when the integrated circuit IC1 is grounded and provided with a supply voltage.

When the vehicle is being assembled or during repair work on the vehicle, it can happen that 12 volts or a ground connection are inadvertently applied to the glow pencil control outputs G1-G4. This can cause the destruction of the power transistors T1-T4 or of other components of the glow time control device. Moreover, while the vehicle is being assembled or repaired, it might happen that the polarity is reversed or that the glow time control device 100 is connected erroneously in some other way, as a result of which harmful voltages are applied to the terminals of the glow time control device. Furthermore, when the glow time control device is being handled, it can happen, for instance, that high voltages, for example, of a few hundred or thousand volts occur due to electrostatic discharges at the terminals of the glow time control device. For this reason, the glow time control device of FIG. 1 has protective circuits that will be described in detail below and that serve to prevent destruction of the glow time control device, thus ensuring a reliable operation of the vehicle in which the glow time control device has been installed.

A first protective circuit consists of the diode D9, the resistor R20, the diode D12, the transistor T7, the capacitor C18, the transistor T6 and the resistor R12. In the case of a short circuit to +12 V at the glow pencil control output G1, the gate of T4 can be actuated if, in the integrated circuit IC1, there is a high resistance between the control output GG1 and the ground. The resistance in the integrated circuit IC1 can amount, for instance, to several hundred kilo ohms, especially if no supply voltage VCC is being provided via the terminal 87 of the glow time control device. Moreover, if the terminal SG1 at the integrated circuit IC1 is pulled very strongly upwards, it can happen that the control output GG1 might also be slightly raised. Consequently, the power transistor T4 might be inadvertently through-connected, as a result of which the power transistor T4 or a glow pencil connected to it might be damaged. If no supply voltage VCC is coming from the terminal 87, the integrated circuit IC1 does not provide any voltage at the output VDD. Since the output VDD is coupled to the base of the transistor T7, the transistor T7 is blocked in this case. As long as battery voltage is present on the terminals 30 or 30_1, the transistor T6 is actuated via the diode D9 and the resistor R20, and the transistor T6 connects the gates of the power transistors T1 and T4 via the resistor R12 to the ground, as a result of which the power transistors T1 and T4 are blocked.

This can prevent the transistor T4 from being inadvertently switched on, for example, if +12 volts are applied to the glow pencil control output G1. Conversely, the protective circuit of the transistor T6 prevents the power transistor T1 from being through-connected if a potential of +12 V is inadvertently applied to the glow pencil control output G4. The diode D9, the resistor R20 and the diode D12 are protective measures for the transistor T6. If the integrated circuit IC1 receives the supply voltage VCC via the terminal 87, the integrated circuit IC1 emits a voltage via the terminal VDD, for instance, of 4 volts, at the base of the transistor T7, as a result of which the latter becomes conductive and blocks the transistor T6. Therefore, the protective circuit of the transistor T6 is deactivated when the circuit IC1 is active since, in this case, the integrated circuit IC1 controls the potential at the control output GG1, thus providing protection for the power transistors T1 and T4. Moreover, the blocking of the transistor T6 prevents the actuation of the power transistors T1 and T4 from being influenced by the control output GG1 due to the protective circuit around the transistor T6. The transistor T6 can be configured as a field-effect transistor (FET), making it possible to comply with the required bias current in the sleep mode of the glow time control device 100.

The resistors R11, R18, R19 and R17, which are associated with the power transistors T1-T4, constitute an additional protective circuit. By means of the resistors R11, R17, R18 and R19, the gates of the power transistors T1-T4 are biased to the potential of the source terminals of the power transistors T1-T4 so that, in the absence of a control signal at the high-ohmic gate input of the power transistors T1-T4, the gate input is pulled downwards in order to switch off the power transistors T1-T4. The control signal at the gate of the power transistors T1-T4 can be absent, for instance, if the integrated circuit IC1 fails, if one of the terminal pins GG1-GG3 breaks off or if the connection between the integrated circuit IC1 and the power transistors T1-T4 is interrupted.

The diode pairs D4 and D8 constitute an additional protective mechanism. Due to the parallel connection of the gates of the power transistors T1 and T4 at the shared control output GG1, a short circuit, for example, of the glow pencil control output G1 to the ground can give rise to a high voltage differential between the gate and the source of the power transistor T1, for instance, a voltage of approximately 25 V. Under normal circumstances, that is to say, without the short-circuit of G1 to the ground, this does not take place since here the gate is moved up and down slowly and the source terminal of the power transistor T1 then follows. In order to avoid this voltage differential and also to prevent the power transistor T4 from being influenced by this voltage differential, the voltage between the gate and the source at the power transistor T1 is limited by the diode pair D4, for example, to 18 V. The diode pair D4 consists of two Zener diodes that are series-connected and oriented in opposite directions. The diode pair D8 provides comparable protection at the power transistor T4.

The transistors T5A, T5B, T8A and T8B provide protection in case of chassis shift or chassis loss. They actively switch off the power transistors T1-T4 before the chassis potential rises above the threshold voltage relative to the glow pencil chassis potential. The diodes D7, D10 and D11 decouple the base currents, ensure the current flow in the correct direction and determine the threshold voltage. The capacitors C10, C13, C20 and C21 debounce this effect and delay the switching, for instance, by 50 μs to 100 μs. Owing to the joint actuation of the power transistors T1 and T4 by the control output GG1, the diodes D6A and D6B are additionally employed in order to prevent the power transistors T1 and T4 from influencing each other, as will be shown below. In the case of a short of G1 to plus, the potential of the gate of the power transistor T4 is too high, as has been described above in conjunction with the protective circuit around the transistor T6. Owing to the raised potential at the control output G1, the emitter base gap of T5B breaks down at a voltage of more than 5 V. As a result, the PN transition from the base to the collector in the transistor T5B takes place. Without the diode D6A, the gate would now be raised by the power transistor T4 by approximately 6 volts below the voltage at the terminal SG1, as a result of which the power transistor T4 would connect through. In this case, the diode D6A blocks the current flow but allows the blocking in case of chassis shift. The diode D6A is preferably a Schottky diode in order to keep the forward voltage low and, under all circumstances, below the FET threshold voltage of typically 2 volts. The diode D6B provides comparable protection for the power transistor T1 in the case of a short of G4 to plus.

As an additional protection for the glow time control device 100, eight ESD spark gaps F1-F8 against very high overvoltages and discharges are provided at the external terminals 30_1, 87, ST, DI, G1, G2, G3 and G4, and they dissipate the energy of such overvoltages and discharges to the ground. Such electrostatic discharges can amount to several hundred to several thousand volts. The ESD spark gaps F1-F8 are located directly next to the plug connections on the printed circuit board and allow an electric spark to arc in a defined manner before the spark can go further into the device. The ESD spark gaps are printed circuit board structures, that is to say, the electric spark arcs in the air between two conductors. This also affords protection to high-ohmic inputs.

Finally, four fuses 9-12 are provided in the glow time control device 100, namely, in the supply voltage lines leading to the drain terminals of the power transistors T1-T4. In this manner, the individual paths for the glow pencils G1-G4 are individually protected. Consequently, the individual paths can be systematically actuated and correspondingly deactivated.

Figure 2:
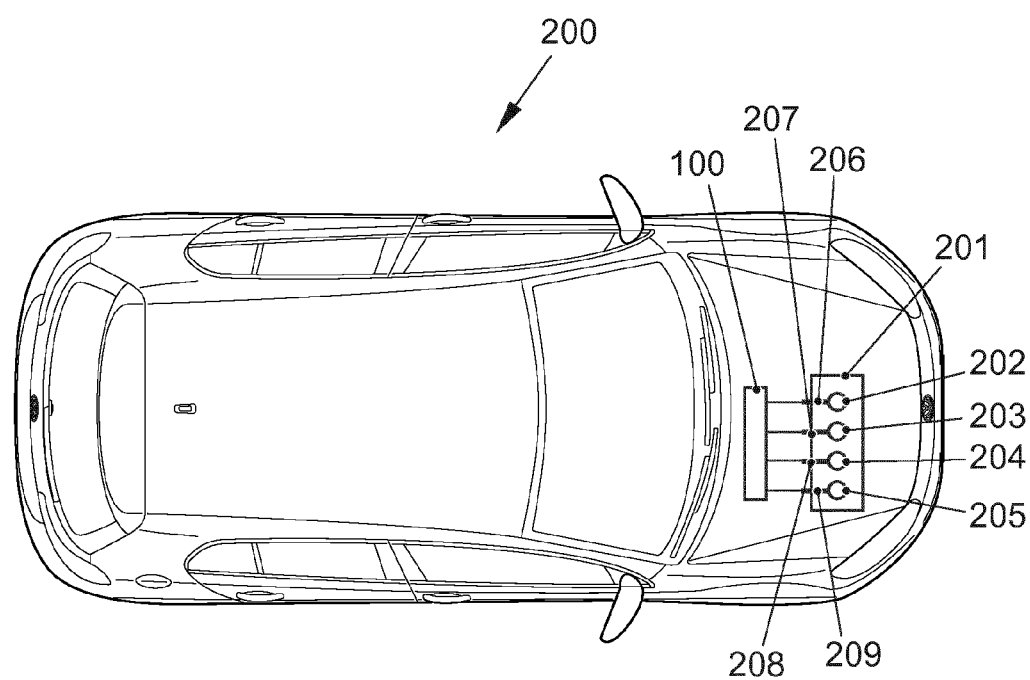
FIG. 2 shows a vehicle with a glow time control device according to an embodiment of the present invention.

FIG. 2 shows a vehicle 200 with an engine 201 having four cylinders 202-205. A glow pencil 206-209 is associated with each cylinder 202-205. The glow pencils 206-209 are actuated by a glow time control device 100.

The invention claimed is:

1. A glow control unit for actuating glow pencils in a motor vehicle, comprising:
   a control unit having a control output for emitting a control signal,
   a supply-voltage input, and
   a supply-voltage output, whereby the control unit is configured to provide an output voltage at the supply-voltage output as a function of the voltage at the supply-voltage input;
   at least two power transistors, each of which is associated with a glow pencil control output and whose control inputs are coupled to the control output of the control unit; and
   a protective circuit having a protective circuit output that is coupled to the control inputs of the at least two power transistors, and having an input that is coupled to the supply-voltage output of the control unit,
   whereby the protective circuit is configured to set a prescribed potential at the protective circuit output if the output voltage of the control unit is below a prescribed value.

2. The glow control unit according to claim 1, whereby the prescribed potential is a potential that blocks the at least two power transistors.

3. A vehicle, comprising:
   at least one glow pencil, and
   a glow control unit according to claim 1, which is coupled to the at least one glow pencil.

* * * * *